(12) United States Patent
Paek et al.

(10) Patent No.: US 10,840,314 B2
(45) Date of Patent: Nov. 17, 2020

(54) METHOD FOR MANUFACTURING ELECTROLUMINESCENT DISPLAY DEVICE

(71) Applicant: LG Display Co., Ltd., Seoul (KR)

(72) Inventors: SeungHan Paek, Bucheon-si (KR); Jeongwon Lee, Paju-si (KR); Jonghoon Yeo, Bucheon-si (KR); Jihoon Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/388,025

(22) Filed: Apr. 18, 2019

(65) Prior Publication Data

US 2019/0245019 A1    Aug. 8, 2019

Related U.S. Application Data

(62) Division of application No. 15/842,767, filed on Dec. 14, 2017, now Pat. No. 10,312,307.

(30) Foreign Application Priority Data

Dec. 29, 2016 (KR) .......................... 10-2016-0181792

(51) Int. Cl.
| | |
|---|---|
| *H01L 29/08* | (2006.01) |
| *H01L 27/32* | (2006.01) |
| *H01L 51/56* | (2006.01) |
| *H01L 51/52* | (2006.01) |

(52) U.S. Cl.
CPC ...... *H01L 27/3246* (2013.01); *H01L 27/3258* (2013.01); *H01L 51/5209* (2013.01); *H01L 51/56* (2013.01)

(58) Field of Classification Search
CPC . H01L 27/32; H01L 27/3246; H01L 27/3258; H01L 51/5209; H01L 51/56
See application file for complete search history.

(56) References Cited

U.S. PATENT DOCUMENTS

| | | |
|---|---|---|
| 6,194,837 B1 | 2/2001 | Ozawa |
| 6,373,453 B1 | 4/2002 | Yudasaka |
| 6,380,672 B1 | 4/2002 | Yudasaka |
| 6,388,377 B1 | 5/2002 | Kobayashi et al. |
| 6,476,988 B1 | 11/2002 | Yudasaka |
| 6,575,800 B1 | 6/2003 | Kobayashi et al. |
| 6,623,097 B2 | 9/2003 | Okada et al. |
| 6,630,274 B1 | 10/2003 | Kiguchi et al. |
| 6,755,983 B2 | 6/2004 | Yudasaka |
| 6,852,994 B2 | 2/2005 | Seki et al. |
| 6,906,458 B2 | 6/2005 | Kobayashi |
| 6,949,883 B2 | 9/2005 | Matsueda |
| 6,967,352 B2 | 11/2005 | Yudasaka |

(Continued)

*Primary Examiner* — Phuc T Dang
(74) *Attorney, Agent, or Firm* — Seed IP Law Group LLP

(57) ABSTRACT

Disclosed are an electroluminescent display device and a method of manufacturing the same. The electroluminescent display device includes a first bank on a substrate, an anode electrode extending to one side and another side of the first bank in an area exposed by the first bank, a second bank on each of one side and another side of the anode electrode, a light emitting layer on an upper surface of the anode electrode exposed by the second bank, and a cathode electrode on the light emitting layer. Since the anode electrode is provided on the first bank, the anode electrode is prevented from being damaged in a process of patterning the first bank.

12 Claims, 8 Drawing Sheets

(56) References Cited

U.S. PATENT DOCUMENTS

| | | | |
|---|---|---|---|
| 7,015,503 B2 | 3/2006 | Seki et al. | |
| 7,056,180 B2 | 6/2006 | Morii | |
| 7,214,959 B2 | 5/2007 | Seki et al. | |
| 7,273,801 B2 | 9/2007 | Seki et al. | |
| 7,442,955 B2 | 10/2008 | Seki et al. | |
| 7,932,518 B2 | 4/2011 | Seki et al. | |
| 8,372,731 B2 | 2/2013 | Li et al. | |
| 2002/0079833 A1 | 6/2002 | Kobayashi et al. | |
| 2003/0143339 A1 | 7/2003 | Kobayashi | |
| 2003/0151568 A1 | 8/2003 | Ozawa | |
| 2007/0098879 A1* | 5/2007 | Makiura | H01L 51/5088 427/66 |
| 2007/0264814 A1* | 11/2007 | Hirai | H01L 21/288 438/617 |
| 2008/0023695 A1* | 1/2008 | Cho | H01L 27/3246 257/40 |
| 2009/0026467 A1 | 1/2009 | Yanagihara | |
| 2009/0303165 A1 | 12/2009 | Yudasaka | |
| 2010/0045577 A1 | 2/2010 | Yudasaka | |
| 2012/0068202 A1 | 3/2012 | Saito et al. | |
| 2014/0022622 A1 | 1/2014 | Park et al. | |
| 2015/0060820 A1* | 3/2015 | Takagi | H01L 51/5218 257/40 |
| 2016/0133678 A1* | 5/2016 | Beak | H01L 27/3248 257/40 |
| 2016/0190217 A1* | 6/2016 | Park | H01L 51/0005 257/40 |
| 2017/0235396 A1* | 8/2017 | Gong | G02F 1/13338 349/12 |

\* cited by examiner

METHOD FOR MANUFACTURING ELECTROLUMINESCENT DISPLAY DEVICE

CROSS-REFERENCE TO RELATED APPLICATIONS

This application claims the benefit of the Korean Patent Application No. 10-2016-0181792 filed on Dec. 29, 2016, which is hereby incorporated by reference as if fully set forth herein.

BACKGROUND

Technical Field

The present disclosure relates to a display device, and more particularly, to an electroluminescent display device and a method of manufacturing the same.

Description of the Related Art

Electroluminescent display devices are devices which have a structure where a light emitting layer is provided between two electrodes, and thus, emit light with an electric field between the two electrodes to display an image.

The light emitting layer may be formed of an organic material which emits light when an exciton generated by a combination of an electron and a hole is shifted from an excited state to a ground state. Alternatively, the light emitting layer may be formed of an inorganic material such as a quantum dot.

Hereinafter, a related art electroluminescent display device will be described with reference to FIG. 1.

FIG. 1 is a schematic cross-sectional view of a related art soluble electroluminescent display device.

As seen in FIG. 1, in the related art soluble electroluminescent display device, a planarization layer 1, an anode electrode 2, a first bank 3, a second bank 4, a light emitting layer 5, and a cathode electrode 6 are sequentially provided on a substrate (not shown).

The planarization layer 1 planarizes a thin film transistor (TFT) layer (not shown) provided on the substrate, and the anode electrode 2 is provided on the planarization layer 1.

The first bank 3 and the second bank 4 are provided on the anode electrode 2 to define a pixel area. The first bank 3 and the second bank 4 are provided on each of one side and the other side of the anode electrode 2 to expose an upper surface of the anode electrode 2. The first bank 3 is formed of an inorganic material.

The light emitting layer 5 is provided in the pixel area defined by the first bank 3 and the second bank 4, and the cathode electrode 6 is provided on the light emitting layer 5.

In detail, in the soluble electroluminescent display device, in order to increase the convenience and efficiency of a manufacturing process, a light emitting material having a soluble characteristic is sprayed or dropped on the pixel area defined by the first and second banks 3 and 4 through an inkjet printing process, and then, by curing the light emitting material, the light emitting layer 5 is formed.

Particularly, in the related art soluble electroluminescent display device, as described above, the bank is formed of a multilayer including the first bank 3 and the second bank 4 so as to prevent a pileup phenomenon.

The pileup phenomenon denotes that in a case of spraying a light emitting material through an inkjet printing process, the light emitting layer 5 is formed thicker in an edge adjacent to the bank than a center between banks spaced apart from each other. When the light emitting layer 5 is not planarly formed, luminance non-uniformity occurs in a pixel area. For this reason, in the related art, in order to prevent the pileup phenomenon, the bank is formed of a multilayer, and by spraying the light emitting material on an upper surface of the first bank 3, the light emitting layer 5 is planarly formed on an upper surface of the anode electrode 2.

However, the related art soluble electroluminescent display device has the following problem.

As described above, the first bank 3 including an inorganic material should be deposited through a chemical vapor deposition (CVD) process after the planarization layer and the TFT layer are formed, but since the first bank 3 should be patterned through a dry etching or wet etching process in a process of forming the first bank 3 through the CVD process, the anode electrode 2 is damaged in an etching process.

BRIEF SUMMARY

Accordingly, the present disclosure is directed to provide an electroluminescent display device and a method of manufacturing the same that substantially obviate one or more problems due to limitations and disadvantages of the related art.

An aspect of the present disclosure is directed to provide an electroluminescent display device and a method of manufacturing the same, in which an anode electrode is prevented from being damaged in a process of forming a bank on the anode electrode.

Another aspect of the present disclosure is directed to provide an electroluminescent display device and a method of manufacturing the same, in which a light emitting layer is provided on an anode electrode to have a uniform thickness, for realizing uniform luminance.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display device including a first bank on a substrate, an anode electrode extending to one side and another side of the first bank in an area exposed by the first bank, a second bank on each of one side and another side of the anode electrode, a light emitting layer on an upper surface of the anode electrode exposed by the second bank, and a cathode electrode on the light emitting layer.

In another aspect of the present disclosure, there is provided a method of manufacturing an electroluminescent display device including forming a first bank on a substrate by using an inorganic material, forming an anode electrode to extend to one side and another side of the first bank in an area exposed by the first bank, forming a second bank including an organic material on each of one side and another side of the anode electrode, forming a light emitting layer on an upper surface of the anode electrode exposed by the second bank, and forming a cathode electrode on the light emitting layer.

It is to be understood that both the foregoing general description and the following detailed description of the present disclosure are to provide examples example and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
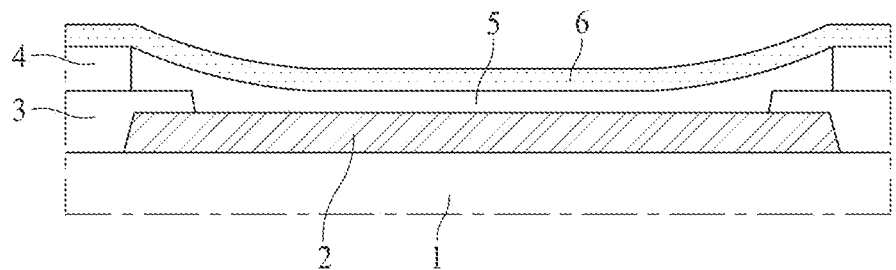
FIG. 1 is a schematic cross-sectional view of a related art soluble electroluminescent display device.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of the present disclosure will be described in detail with reference to the accompanying drawings.

Figure 2:
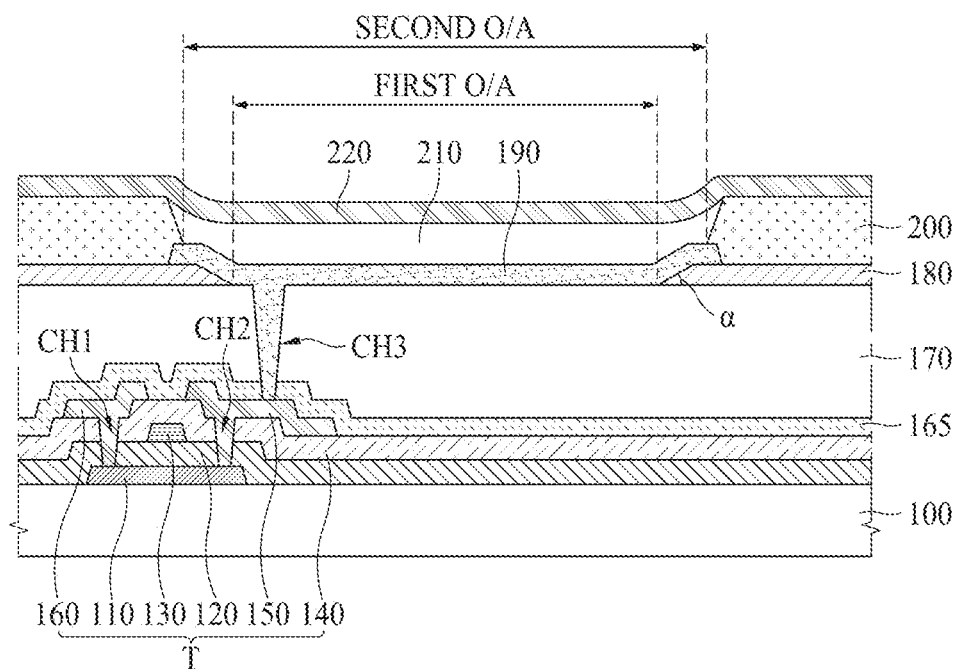
FIG. 2 is a cross-sectional view of an electroluminescent display device according to a first embodiment of the present disclosure.

FIG. 2 is a cross-sectional view of an electroluminescent display device according to a first embodiment of the present disclosure.

The electroluminescent display device according to the first embodiment of the present disclosure may be implemented as a top emission type.

As illustrated in FIG. 2, the electroluminescent display device according to the first embodiment of the present disclosure may include a thin film transistor (TFT) layer T, a passivation layer 165, a planarization layer 170, a first bank 180, an anode electrode 190, a second bank 200, a light emitting layer 210, and a cathode electrode 220 which are provided on a substrate 100.

The TFT layer T may include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Although not shown, a light blocking layer may be further formed between the substrate 100 and the active layer 110, and in this case, external light incident through a bottom of the substrate 100 may be blocked by the light blocking layer, thereby preventing the active layer 110 from being damaged by the external light.

The gate insulation layer 120 may be formed on the active layer 110. The gate insulation layer 120 may insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto.

The gate electrode 130 may be formed on the gate insulation layer 120. The gate electrode 130 may be formed to overlap the active layer 110 with the gate insulation layer 120 therebetween. The gate electrode 130 may be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof, but is not limited thereto.

The interlayer dielectric 140 may be formed on the gate electrode 130. The interlayer dielectric 140 may be formed of an inorganic insulating material (for example, silicon oxide (SiOx), silicon nitride (SiNx), or a multilayer thereof) which is the same as that of the gate insulation layer 120, but is not limited thereto.

The source electrode 150 and the drain electrode 160 may be formed on the interlayer dielectric 140 to face each other. The gate insulation layer 120 and the interlayer dielectric 140 may include a first contact hole CH1, exposing one area of the active layer 110, and a second contact hole CH2 which exposes the other area of the active layer 110. Accordingly, the source electrode 150 may be connected to the other area of the active layer 110 through the second contact hole CH2, and the drain electrode 160 may be connected to the one area of the active layer 110 through the first contact hole CH1.

In FIG. 2, the source electrode 150 and the drain electrode 160 are illustrated as a single layer, but are not limited thereto.

For example, the source electrode 150 may include a bottom source electrode (not shown) and a top source electrode (not shown), and the bottom source electrode may be formed between the interlayer dielectric 140 and the top source electrode to enhance an adhesive force between the interlayer dielectric 140 and the top source electrode. Also, the bottom source electrode may protect a lower surface of the top source electrode, thereby preventing the lower surface of the top source electrode from being corroded. Therefore, an oxidation rate of the bottom source electrode may be lower than that of the top source electrode. That is, a material of the bottom source electrode may be a material having a corrosion resistance which is stronger than that of a material of the top source electrode. As described above, the bottom source electrode may act as an adhesion promotor or an anti-corrosion layer and may be formed of an alloy (MoTi) of molybdenum (Mo) and titanium (Ti), but is not limited thereto.

Moreover, the top source electrode may be formed on an upper surface of the bottom source electrode. The top source electrode may be formed of copper (Cu) which is metal having a low resistance, but is not limited thereto. The top source electrode may be formed of metal having a resistance which is relatively lower than that of the bottom source electrode. In order to decrease a total resistance of the source electrode 150, a thickness of the top source electrode may be set thicker than that of the bottom source electrode.

Similarly to the source electrode 150, the drain electrode 160 may also include a bottom drain electrode (not shown) and a top drain electrode (not shown). However, the present embodiment is not limited thereto. In other embodiments, the source electrode 150 and the drain electrode 160 may each be formed of a multilayer including more layers than those of a triple layer.

A structure of the TFT layer T is not limited to a structure shown in the drawing, and may be variously modified into a structure known to those skilled in the art. For example, in the drawing, the TFT layer T is illustrated as having a top gate structure where the gate electrode 130 is provided on the active layer 110, but is not limited thereto. In other embodiments, the TFT layer T may be formed in a bottom gate structure where the gate electrode 130 is provided under the active layer 110.

The passivation layer 165 may be formed on the TFT layer T, and in more detail, may be formed on an upper surface of each of the source electrode 150 and the drain electrode 160. The passivation layer 165 may protect the TFT layer T and may be formed of an inorganic insulating material, for example, silicon oxide (SiOx), silicon nitride (SiNx), or a multilayer thereof, but is not limited thereto.

The planarization layer 170 may be formed on the passivation layer 165. The planarization layer 170 may planarize an upper surface of the substrate 100 on which the TFT layer T is provided. The passivation layer 170 may be formed of an organic insulating material such as acryl resin, epoxy resin, phenolic resin, polyamide resin, polyimide resin, and/or the like, but is not limited thereto.

The first bank 180 may be provided on the planarization layer 170. The first bank 180 may perform a function which enables an edge of the anode electrode 190 to have a slope. This will be described below in detail. The first bank 180 may be provided on the planarization layer 170 to expose a first opening area (or a first O/A) having a predetermined width. When the electroluminescent display device is implemented as a bottom emission type, the first opening area may correspond to an emissive area.

A side surface of the first bank 180 may be inclined at a certain angle with respect to a surface of the substrate 100. In detail, as illustrated in FIG. 2, an included angle "α" between the side surface of the first bank 180 and the surface of the substrate 100 may be set to 45 degrees or less.

That is, when the side surface of the first bank 180 is provided vertical to the surface of the substrate 100, a leakage of a current can occur in the side surface of the first bank 180 which is relatively sharply provided, and thus, in an embodiment of the present disclosure, the included angle "α" between the side surface of the first bank 180 and the surface of the substrate 100 may be set to 45 degrees or less, thereby preventing a current from being leaked through the first bank 180. Since the top surface of planarization layer 170 is parallel to the top surface of the substrate 100 and is also planar, the side edge of first bank 180 is an included angle "α" between the side surface of the first bank 180 and the surface of the planarization layer 170. This can be set to 45 degrees or less, as noted. In one embodiment, it is set to be about 45 degrees; in another embodiment, it is set to be less than 45 degrees and greater than 30 degrees; in other embodiments, it can be set to be less than 40 degrees and greater than 25 degrees. In other embodiments, it may be set to be less than 60 degrees but greater than 45 degrees. The selection of the angle may be based on many factors, one of which may include a preferred angle to reduce the pileup phenomenon, which has been explained herein.

The first bank 180 may be formed of an inorganic material, for example, silicon oxide (SiOx), silicon nitride (SiNx), or a multilayer thereof, but is not limited thereto. The first bank 180 may be formed of an inorganic material on the planarization layer 170 through a chemical vapor deposition (CVD) process. Therefore, the first bank 180 may be formed of a thin layer having a thickness of about 500 Å.

The anode electrode 190 may be provided on the planarization layer 170 and the first bank 180.

The anode electrode 190 may be provided on the planarization layer 170 at the locations exposed by the first bank 180 and extend from one side to the other side of the first bank 180. The passivation layer 165 and the planarization layer 170 may include a third contact hole CH3 which exposes the source electrode 150, and the source electrode 150 may be connected to the anode electrode 190 through the third contact hole CH3. Therefore, in the first embodiment of the present disclosure, in order for the source electrode 150 to be connected to the anode electrode 190 through the third contact hole CH3, the first bank 180 may be spaced apart from the third contact hole CH3 without overlapping the third contact hole CH3.

As described above, in the electroluminescent display device according to an embodiment of the present disclosure, the first bank 180 may be first provided on the planarization layer 170, and the anode electrode 190 is then provided on the first bank 180. This sequence prevents the anode electrode 190 from being damaged in a process of patterning the first bank 180 that includes an inorganic material.

In detail, in those situations in which the anode electrode 190 is first formed and the first bank 180 including an inorganic material is deposited on the anode electrode 190, the first bank 180 may be formed through a CVD process. Since the first bank 180 should be patterned through a dry etching or wet etching process in the above-described process, the anode electrode 190 is likely to be damaged in the etching process.

Therefore, in an embodiment of the present disclosure, the first bank 180 may be first formed, and then patterned and etched on the planarization layer 170 to provide locations in which the planarization layer is exposed through the first bank. The anode electrode 190 may be formed on the first bank 180 and on the exposed locations of the planarization layer 170, thereby preventing the anode electrode 190 from being damaged in a process of patterning the first bank 180 including an inorganic material.

The anode electrode 190 may be provided to extend from one side and to the other side of the first bank 180 as well as an upper surface of the planarization layer 170. In this case, the side surface of the first bank 180 may be inclined at an angle of 45 degrees or less with respect to the surface of the substrate 100 when it is etched, and thus, the anode electrode 190 may also be provided on each of the one side and the other side of the first bank 180 to have a slope.

When the electroluminescent display device according to the first embodiment of the present disclosure is implemented as a top emission type, since the anode electrode 190 should reflect light emitted from the light emitting layer 210 in an up direction, the anode electrode 190 may include a material which has a good in reflectivity. The anode electrode 190 may be formed of a multilayer of different metals and metal alloys that have a good light reflectivity.

For example, the anode electrode 190 may include a bottom anode electrode (not shown), a top anode electrode (not shown), and a cover anode electrode (not shown). Namely, the anode 190 maybe comprised of two or more layers. The bottom anode electrode may be provided between the planarization layer 170 and the top anode electrode to increase an adhesive force between the planarization layer 170 and the top anode electrode. The top anode electrode may be provided between the bottom anode electrode and the cover anode electrode. The top anode electrode may be formed of metal having a resistance which is relatively lower than that of each of the bottom anode electrode and the cover anode electrode. In order to decrease a total resistance of the anode electrode 190, a thickness of the top anode electrode may be set thicker than that of each of the bottom anode electrode and the cover anode electrode. The cover anode electrode may be provided on the top anode electrode. The cover anode electrode may be provided to cover an upper surface and a side surface of the top anode electrode, thereby preventing the top anode electrode from being corroded. Accordingly, an oxidation rate of the cover anode electrode may be lower than that of the top anode electrode. That is, the cover anode electrode may be formed of a material having a corrosion resistance which is stronger than that of a material of the top anode electrode.

However, the present embodiment is not limited thereto. In other embodiments, the anode electrode 190 may be formed of a double layer or a multilayer including more layers than those of a quadruple layer.

The second bank 200 may be provided on the anode electrode 190.

The second bank 200 may be provided on each of one side and the other of the anode electrode 190 to expose an upper surface of the anode electrode 190. Since the second bank 200 is provided to expose the upper surface of the anode electrode 190, an area on which an image is displayed is secured. The second bank 200 may be provided on the anode electrode 190 to expose a second opening area (a second O/A) having the predetermined width. When the electroluminescent display device according to an embodiment of the present disclosure is implemented as the top emission type, the second opening area may correspond to an emissive area.

The second opening area exposed by the second bank 200 may be provided wider than the first opening area exposed by the first bank 180. That is, when the electroluminescent display device according to an embodiment of the present disclosure is implemented as the top emission type, the second opening area may correspond to an emissive area, and thus, the second opening area may be provided wider than the first opening area, thereby enhancing an aperture ratio.

Moreover, since the second opening area is provided wider than the first opening area, the electroluminescent display device according to an embodiment of the present disclosure has the following effects.

In detail, if the first opening area is provided wider than the second opening area than the result may be that the second bank 200 is provided up to the upper surface of the anode electrode 190 provided at locations that do not overlie either side of the first bank 180. In this case, in the anode electrode 190, only that region of the upper surface which is planar with respect to the substrate may be exposed, and the area of anode electrode 190 which is inclined by the first bank 180 may be covered by the second bank 200. The light emitting layer 210 may be provided from the planar upper surface of the anode electrode 190 to a side surface of the second bank 200, and thus, a pileup phenomenon occurs.

The pileup phenomenon denotes that in a case of forming the light emitting layer 210 through an inkjet printing process, in performing a process where a light emitting material of the light emitting layer 210 is sprayed or dropped on the anode electrode 190 and then is dried, the light emitting material is dried and cured, and then, a thickness of the light emitting layer 210 provided in an area contacting the second bank 200 is thicker than that of the light emitting layer 210 provided on an upper surface of the anode electrode 190, causing a thickness deviation.

As a result, the light emitting layer 210 may be planarly provided in a center of the second opening area of the anode electrode 190 exposed by the second bank 200 and may have a cross-sectional surface having a thickness which increases progressively closer to a portion adjacent to the second bank 200. Also, if the light emitting layer 210 is provided on the anode electrode 190 to have a non-uniform thickness, luminance non-uniformity occurs.

Therefore, in an embodiment of the present disclosure, since the second opening area is provided wider than the first opening area, the upper surface of the anode electrode 190 which is provided on each of the one side and the other side of the first bank 180 has a slope that may be exposed by the second bank 200. Also, the light emitting layer 210 may be provided on the anode electrode 190 having the slope, thereby preventing the pileup phenomenon.

That is, when the light emitting layer 210 is provided on only the planar upper surface of the anode electrode 190, the light emitting layer 210 may be relatively thicker provided in an area adjacent to an end region of the anode electrode 190 and the second bank 200. Therefore, in an embodiment of the present disclosure, a region of the anode electrode 190 having a slope may be exposed, and the light emitting layer 210 may be provided covering the exposed region, thereby decreasing a thickness deviation of the light emitting layer 210.

The bank 200 may be provided on each side of the anode electrode 190, and thus, a side surface of the anode electrode 190 vulnerable to corrosion is not exposed to the outside, thereby preventing the side surface of the anode electrode 190 from being corroded.

The second bank 200 may be formed of an organic insulating material such as polyimide resin, acryl resin, benzocyclobutene (BCB), and/or the like, but is not limited thereto.

Particularly, the second bank 200 according to an embodiment of the present disclosure may have the layers below the top region wholly formed of a hydrophilic material, and only an upper surface of the second bank 200 may be formed of a hydrophobic material. That is, the light emitting layer 210 and the cathode electrode 220 may be provided on the anode electrode 190 exposed by the second bank 200, and in this case, since the light emitting layer 210 and the cathode electrode 220 should be provided to have a uniform thickness on the anode electrode 190, in an embodiment of the present disclosure, a side surface of the second bank 200 may be formed of a hydrophilic material. Therefore, the light emitting layer 210 may be provided to extend to only the side surface of the second bank 200 without passing by the upper surface of the second bank 200, and the light emitting layer 210 may be uniformly provided up to the side surface of the second bank 200, whereby the light emitting layer 210 may be provided to have a uniform thickness in the second opening area exposed by the second bank 200.

Hereinabove, an area having hydrophobicity is described as the upper surface of the second bank 200, but the present embodiment is not limited thereto. In other embodiments, an area corresponding to a certain height from the upper surface of the second bank 200 may include a hydrophobic material, and another area may include a hydrophilic material.

The light emitting layer 210 may be provided on the anode electrode 190. The light emitting layer 210 may be provided on the anode electrode 190 exposed by the second bank 200. The light emitting layer 210 may include at least one organic layer of a hole injecting layer, a hole transporting layer, a light emitting layer, an electron transporting layer, and an electron injecting layer. A structure of the light emitting layer 210 may be modified into a structure known to those skilled in the art.

In the electroluminescent display device according to an embodiment of the present disclosure, since the light emitting layer 210 is provided on the anode electrode 190 having a slope in the second opening area exposed by the second bank 200, a thickness deviation of the light emitting layer 210 is reduced, and the pileup phenomenon is prevented.

Particularly, at least one of the hole injecting layer, the hole transporting layer, the light emitting layer, the electron transporting layer, and the electron injecting layer configuring the light emitting layer 210 may be formed through a soluble process. For example, the hole injecting layer, the hole transporting layer, and the light emitting layer may be formed through the soluble process, and the electron transporting layer and the electron injecting layer may be formed through a vapor deposition process. However, the present embodiment is not limited thereto.

As described above, the soluble process may be a process where a soluble organic light emitting material is sprayed on the anode electrode 190 through an inkjet printing process, and by curing the soluble organic light emitting material, the light emitting layer 210 is formed, and is used for increasing the convenience and efficiency of a process of manufacturing the organic light emitting display device.

The cathode electrode 220 may be provided on the light emitting layer 210. In a case where the electroluminescent display device according to an embodiment of the present disclosure is implemented as the top emission type, since the cathode electrode 220 is provided on a surface through which light is output, the cathode electrode 220 may be formed of a transparent conductive material.

Although not shown, an encapsulation layer may be additionally provided on the cathode electrode 220 to prevent penetration of water. The encapsulation layer may use various materials known to those skilled in the art. Also, although not shown, a color filter may be additionally provided on the cathode electrode 220 in each of a plurality of pixels, and in this case, the light emitting layer 210 may emit white light.

As described above, the electroluminescent display device according to an embodiment of the present disclosure may be implemented in a structure enabling the top emission type, where the light emitted from the light emitting layer 210 is output to the outside through the cathode electrode 220, or the bottom emission type where the light emitted from the light emitting layer 210 is output to the outside through the anode electrode 190, but is not limited thereto. In other embodiments, the electroluminescent display device according to an embodiment of the present disclosure may be implemented in a dual emission type.

Figure 3:
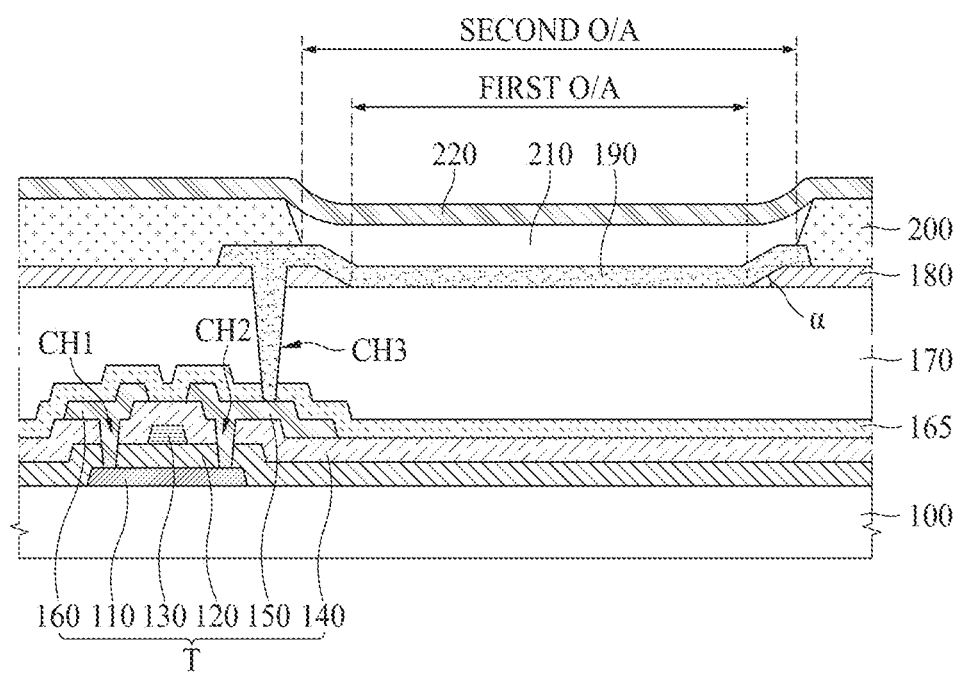
FIG. 3 is a cross-sectional view of an electroluminescent display device according to a second embodiment of the present disclosure.

FIG. 3 is a cross-sectional view of an electroluminescent display device according to a second embodiment of the present disclosure.

The electroluminescent display device according to the second embodiment of the present disclosure may be implemented as the top emission type or the bottom emission type.

Except that a position of a contact hole for connecting an anode electrode to a TFT layer is changed, the electroluminescent display device according to the second embodiment of the present disclosure illustrated in FIG. 3 is the same as the electroluminescent display device of FIG. 2. Hereinafter, therefore, like reference numerals refer to like elements, and only different elements will be described.

As illustrated in FIG. 3, the electroluminescent display device according to the second embodiment of the present disclosure may include a TFT layer T, a passivation layer 165, a planarization layer 170, a first bank 180, an anode electrode 190, a second bank 200, a light emitting layer 210, and a cathode electrode 220 which are provided on a substrate 100.

The passivation layer 165, the planarization layer 170, and the first bank 180 may include a third contact hole CH3 which exposes a source electrode 150 of the TFT layer T, and the source electrode 150 may be connected to the anode electrode 190 through the third contact hole CH3.

In the electroluminescent display device according to the first embodiment of the present disclosure, the third contact hole CH3 may be provided in the passivation layer 165 and the planarization layer 170, but in the electroluminescent display device according to the second embodiment of the present disclosure, the third contact hole CH3 may be provided to pass through the first bank 180.

Therefore, the electroluminescent display device according to the second embodiment of the present disclosure may be implemented as the bottom emission type without the reduction in aperture ratio.

In detail, in the electroluminescent display device according to the first embodiment of the present disclosure, the anode electrode 190 may be connected to the source electrode 150 through the third contact hole CH3 which does not pass through the first bank 180. Also, in the bottom emission type, the first opening area exposed by the first bank 180 may correspond to an emissive area, and the source electrode 150 may be disposed to overlap the first opening area in an area where the third contact hole CH3 is provided. Therefore, when the electroluminescent display device according to the first embodiment of the present disclosure is implemented as the bottom emission type, an aperture ratio can be reduced by the TFT layer T. In order to solve such a problem, in the electroluminescent display device according to the second embodiment of the present disclosure, the anode electrode 190 may be connected to the source electrode 150 through the third contact hole CH3 passing through the first bank 180, and thus, an aperture ratio is not reduced despite the bottom emission type.

That is, as illustrated in FIG. 3, since the third contact hole CH3 is provided in the passivation layer 165, the planarization layer 170, and the first bank 180, the first opening area exposed by the first bank 180 may not overlap the TFT layer T. Therefore, although the electroluminescent display device according to the second embodiment of the present disclosure is implemented as one of the top emission type and the bottom emission type, an aperture ratio is not reduced.

Moreover, in the electroluminescent display device according to the second embodiment of the present disclosure, the third contact hole CH3 may be provided to pass through the first bank 180, and thus, the following effects are obtained.

In detail, even in the electroluminescent display device according to the second embodiment of the present disclosure, the second opening area exposed by the second bank 200 may be provided wider than the first opening area exposed by the first bank 180. Therefore, an upper surface of the anode electrode 190 which is provided on each side of the side of the first bank 180 and has a slope that may be exposed by the second bank 200, thereby preventing the pileup phenomenon.

Particularly, when the electroluminescent display device according to the second embodiment of the present disclosure is implemented as the top emission type, as described above with reference to FIG. 2, a thickness deviation of the light emitting layer 210 provided on the anode electrode 190 is reduced. Also, when the electroluminescent display device according to the second embodiment of the present disclosure is implemented as the bottom emission type, since the emissive area corresponds to the first opening area, the light emitting layer 210 provided on the anode electrode 190 in the first opening area may be more planarly provided than the light emitting layer 210 provided on the anode electrode 190 in the second opening area. Accordingly, when the electroluminescent display device according to the second embodiment of the present disclosure is implemented as the bottom emission type, the light emitting layer 210 provided on an upper surface of the anode electrode 190 may have a uniform thickness, thereby realizing uniform luminance.

As described above, in the electroluminescent display device according to the second embodiment of the present disclosure, the anode electrode 190 may be connected to the source electrode 150 through the third contact hole CH3 which is provided to pass through the first bank 180 as well as the passivation layer 165 and the planarization layer 170. Accordingly, even when the electroluminescent display device according to the second embodiment of the present disclosure is implemented as the bottom emission type, an aperture ratio is not reduced.

In a case where the electroluminescent display device according to the second embodiment of the present disclosure is implemented as the top emission type, since the anode electrode 190 should reflect light emitted from the light emitting layer 210 in an up direction, the anode electrode 190 may include a material which is good in reflectivity. On the other hand, when the electroluminescent display device according to the second embodiment of the present disclosure is implemented as the bottom emission type, the anode electrode 190 may be provided on a surface through which light is output, the anode electrode 190 may be formed of a transparent conductive material such as indium tin oxide (ITO).

When the electroluminescent display device according to the second embodiment of the present disclosure is implemented as the top emission type, the cathode electrode 220 may be provided on a surface through which light is output, and thus, the cathode electrode 220 may be formed of a transparent conductive material. On the other hand, in a case where the electroluminescent display device according to the second embodiment of the present disclosure is implemented as the bottom emission type, since the cathode electrode 220 should reflect the light emitted from the light emitting layer 210 in a down direction, the cathode electrode 220 may include a material which is good in reflectivity.

Moreover, in the electroluminescent display device according to the second embodiment of the present disclosure, the second opening area may be provided wider than the first opening area, and thus, the light emitting layer 210 may be provided from an area where the anode electrode 190 has a slope, thereby decreasing a thickness deviation of the light emitting layer 210 in the emissive area and realizing uniform luminance.

FIGS. 4A to 4F are process cross-sectional views illustrating a method of manufacturing an electroluminescent display device according to a first embodiment of the present disclosure and relate to a method of manufacturing the electroluminescent display device of FIG. 2. Hereinafter, therefore, like reference numerals refer to like elements throughout, and in a material and a structure of each element, repetitive descriptions are omitted.

Figure 4A:
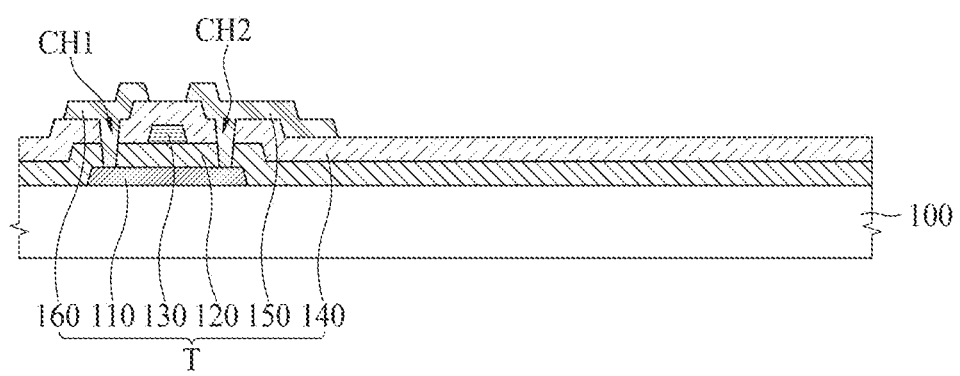
FIGS. 4A to 4F are process cross-sectional views illustrating a method of manufacturing an electroluminescent display device according to a first embodiment of the present disclosure.

First, as seen in FIG. 4A, an active layer 110, a gate insulation layer 120, a gate electrode 130, an interlayer dielectric 140, a source electrode 150, and a drain electrode 160 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, a first contact hole CH1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 may be formed.

The source electrode 150 and the drain electrode 160 may each be formed of a multilayer. The source electrode 150 and the drain electrode 160 may be simultaneously formed of the same material through the same patterning process.

Figure 4B:
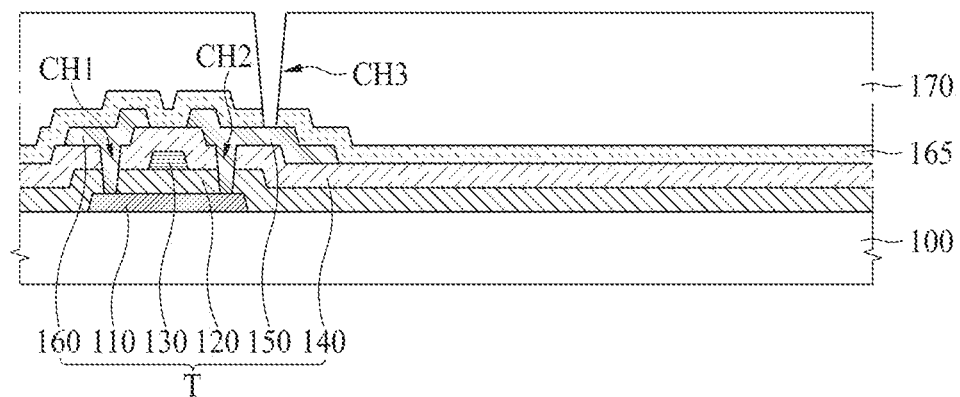

Subsequently, as seen in FIG. 4B, a passivation layer 165 may be formed on the source electrode 150 and the drain electrode 160, and a planarization layer 170 may be formed on the passivation layer 165.

The passivation layer 165 and the planarization layer 170 may be formed to have a third contact hole CH3, and thus, the source electrode 150 may be exposed to the outside through the third contact hole CH3.

Figure 4C:
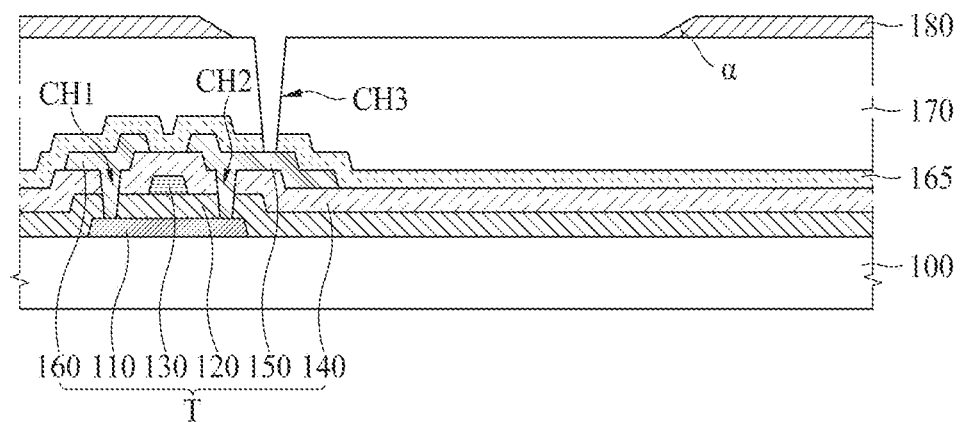

Subsequently, as seen in FIG. 4C, a first bank 180 may be formed on the planarization layer 170. The first bank 180 may be patterned on the planarization layer 170 to expose a predetermined first opening area (or a first O/A). The first bank 180 may be patterned and etch so that when it is completely formed it does not overlap the third contact hole CH3 and may be spaced apart from the third contact hole CH3.

A side surface of the first bank 180 may be inclined at a certain angle with respect to a surface of the substrate 100. In detail, an included angle "α" between the side surface of the first bank 180 and the surface of the substrate 100 may be set to 45 degrees or less.

The side surface of the first bank 180 may be formed so as to be inclined at a certain angle by using various technologies known to those skilled in the art. For example, by using a halftone mask or a slit mask, the first bank 180 may be formed in order for a thickness thereof to be progressively thinned in an edge thereof, and moreover, may be formed to have a constant thickness in an area other than the edge, but the present embodiment is not limited thereto.

The first bank 180 may be formed of an inorganic material, for example, silicon oxide (SiOx), silicon nitride (SiNx), or a multilayer thereof, but is not limited thereto. The first bank 180 may be formed on the planarization layer 170 through a CVD process. Therefore, the first bank 180 may be formed of a thin layer having a thickness of about 500 Å.

Figure 4D:
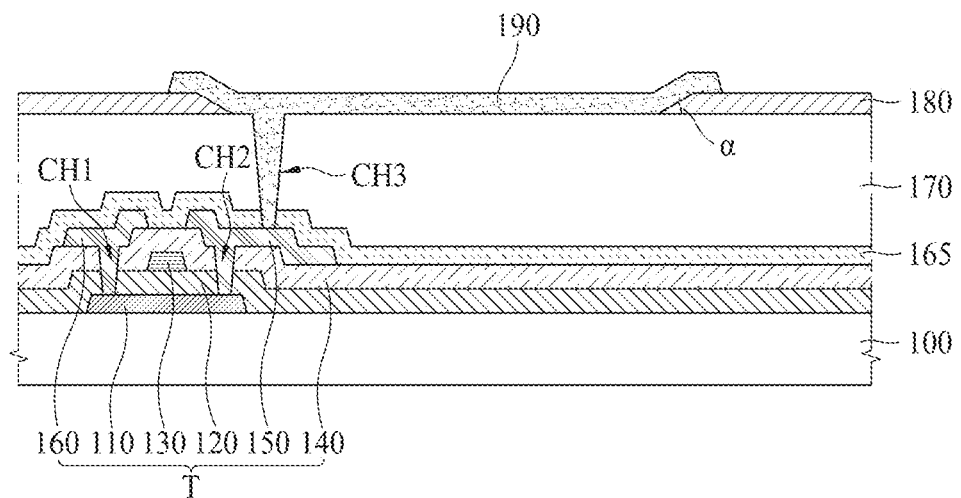

Subsequently, as seen in FIG. 4D, an anode electrode 190 may be formed on the first bank 180. The anode electrode 190 may be formed on the planarization layer 170 exposed by the first bank 180 to extend to one side and the other side of the first bank 180. A side surface of the first bank 180 may be formed to have a certain slope, and thus, an area having a certain slope may be formed in an edge of the anode electrode 190 formed on each of the one side and the other side of the first bank 180. The anode electrode 190 may be formed so as to be connected to the source electrode 150 through the third contact hole CH3 which is formed in the passivation layer 165 and the planarization layer 170.

Figure 4E:
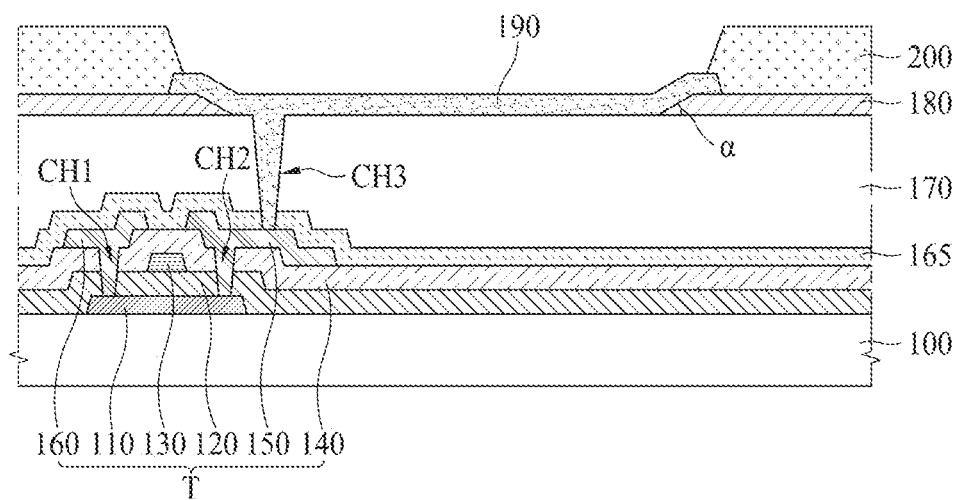

Subsequently, as seen in FIG. 4E, a second bank 200 including an organic material may be formed on the anode electrode 190. In detail, the second bank 200 may be formed on each of one side and the other side of the anode electrode 190 to expose an upper surface of the anode electrode 190. The second bank 200 may be patterned to expose a predetermined second opening area (or a second O/A). The second opening area exposed by the second bank 200 may be formed wider than the first opening area exposed by the first bank 180.

In detail, when the first opening area is formed wider than the second opening area, only an upper surface of the anode electrode 190 which is planar with respect to the substrate may be exposed, and a region of the anode electrode 190 which is inclined by the first bank 180 may be covered by the second bank 200. Also, a light emitting layer 210 may be formed from the planar upper surface of the anode electrode 190 to a side surface of the second bank 200 through a below-described process, and for this reason, the pileup phenomenon occurs. That is, the light emitting layer 210 may be planarly provided in a center of the second opening area of the anode electrode 190 exposed by the second bank 200 and may have a cross-sectional surface having a thickness which increases progressively closer to a portion adjacent to the second bank 200. Also, if the light emitting layer 210 is provided on the anode electrode 190 to have a non-uniform thickness, luminance non-uniformity occurs.

Therefore, in an embodiment of the present disclosure, since the second opening area is provided wider than the first opening area, the upper surface of the anode electrode 190 which is provided on each of the one side and the other side of the first bank 180 and has a slope may be exposed by the second bank 200. Also, the light emitting layer 210 may be provided on the anode electrode 190 having the slope, thereby preventing the pileup phenomenon.

That is, when the light emitting layer 210 is provided on only the planar upper surface of the anode electrode 190, the light emitting layer 210 may be relatively thicker provided in an area adjacent to the anode electrode 190 and the second bank 200. Therefore, in an embodiment of the present disclosure, a region of the anode electrode 190 having a slope may be exposed, and the light emitting layer 210 may be provided from the exposed region, thereby decreasing a thickness deviation of the light emitting layer 210.

A process of patterning the second bank 200 on the one side and the other side of the anode electrode 190 may use a photolithography process, and the second bank 200 may be patterned through various technologies known to those skilled in the art.

In a process of forming the second bank 200 on the anode electrode 190, hydrophobic treatment may be performed on the second bank 200 in order for an upper surface of the second bank 200 to have hydrophobicity. A method of performing the hydrophobic treatment on the upper surface of the second bank 200 may use various technologies known to those skilled in the art. For example, in a process of patterning the second bank 200 with a mask, the hydrophobic treatment may be performed on the upper surface of the second bank 200 by adjusting a degree of exposure performed on the second bank 200, or by using a coating apparatus such as a roller with a hydrophobic material coated thereon, the hydrophobic material may be coated on the upper surface of the second bank 200. However, the present embodiment is not limited thereto.

Figure 4F:
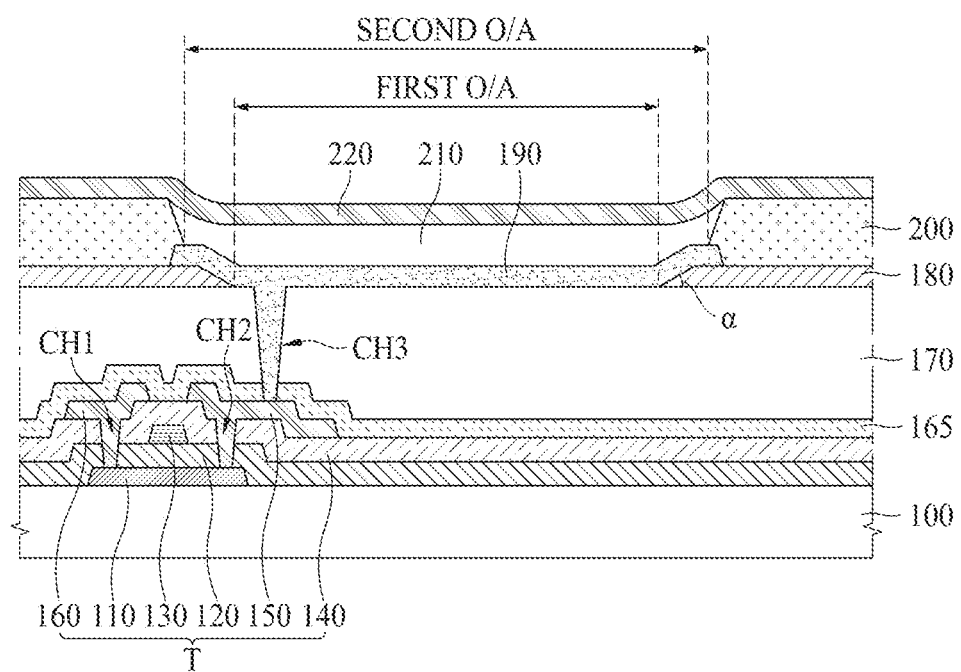

Subsequently, as seen in FIG. 4F, the light emitting layer 210 and a cathode electrode 220 may be sequentially formed on the anode electrode 190. The light emitting layer 210 may be formed by spraying a soluble light emitting material through the inkjet printing process, and as described above, the upper surface of the second bank 200 may be formed of a hydrophobic material. Accordingly, the light emitting layer 210 may be deposited up to the upper surface of the anode electrode 190 and a side surface of the second bank 200, but is not deposited on the upper surface of the second bank 200.

That is, in an embodiment of the present disclosure, the second bank 200 may be wholly formed of a hydrophilic material, and only the upper surface of the second bank 200 may be formed of a hydrophobic material, thereby preventing the light emitting layer 210 from being distributed to an emissive area of another pixel other than the upper surface of the second bank 200.

Moreover, in an embodiment of the present disclosure, the anode electrode 190 may be formed on each of one side and the other side of the first bank 180, and thus, an inclined area may be formed in an edge of the anode electrode 190. Also, the second opening area exposed by the second bank 200 may be formed wider than the first opening area exposed by the first bank 180. Therefore, the light emitting layer 210 may be formed up to an upper surface of the inclined area of the anode electrode 190, thereby reducing a thickness deviation of the light emitting layer 210.

Moreover, in an embodiment of the present disclosure, since the first bank 180 is formed before forming the anode electrode 190, the anode electrode 190 is prevented from being damaged in a process of dry etching or wet etching the first bank 180 including an inorganic material.

FIGS. 5A to 5F are process cross-sectional views illustrating a method of manufacturing an electroluminescent display device according to a second embodiment of the present disclosure and relate to a method of manufacturing the electroluminescent display device of FIG. 3. Hereinafter, therefore, like reference numerals refer to like elements throughout, and in a material and a structure of each element, repetitive descriptions are omitted.

Figure 5A:
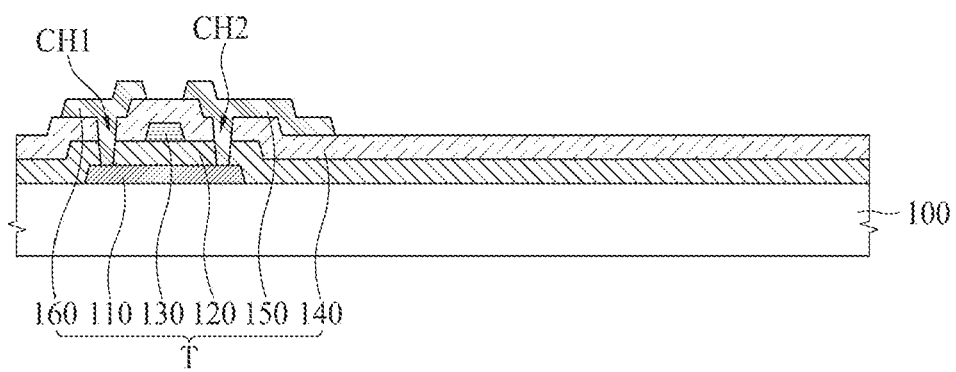
FIGS. 5A to 5F are process cross-sectional views illustrating a method of manufacturing an electroluminescent display device according to a second embodiment of the present disclosure.

First, as seen in FIG. 5A, an active layer 110, a gate insulation layer 120, a gate electrode 130, an interlayer dielectric 140, a source electrode 150, and a drain electrode 160 may be sequentially formed on a substrate 100.

To provide a more detailed description, the active layer 110 may be formed on the substrate 100, the gate insulation layer 120 may be formed on the active layer 110, the gate electrode 130 may be formed on the gate insulation layer 120, the interlayer dielectric 140 may be formed on the gate electrode 130, a first contact hole CH1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 may be formed.

The source electrode 150 and the drain electrode 160 may each be formed of a multilayer. The source electrode 150 and the drain electrode 160 may be simultaneously formed of the same material through the same patterning process.

Figure 5B:
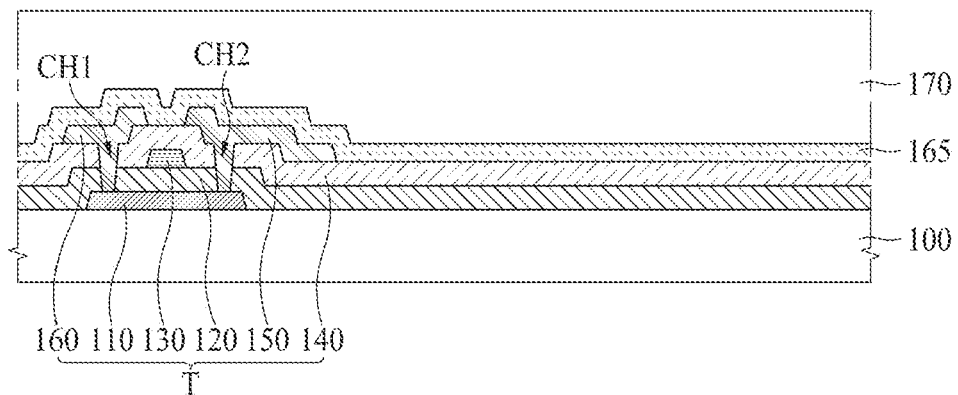

Subsequently, as seen in FIG. 5B, a passivation layer 165 may be formed on the source electrode 150 and the drain electrode 160, and a planarization layer 170 may be formed on the passivation layer 165.

Figure 5C:
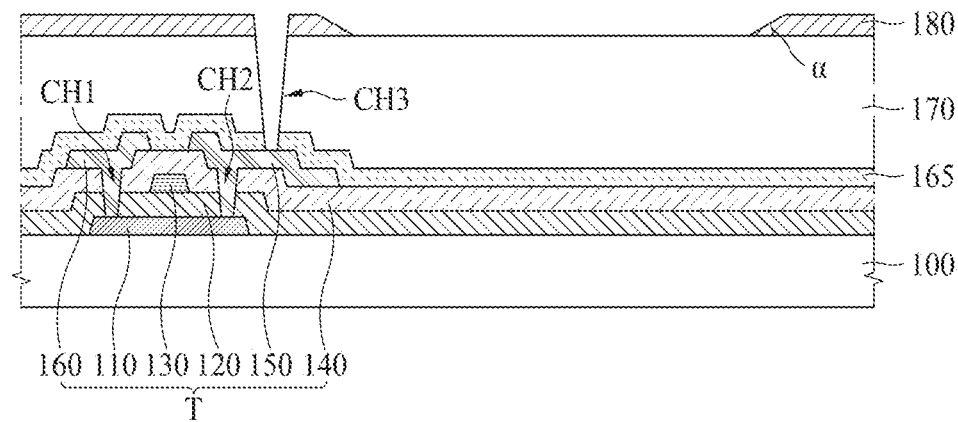

Subsequently, as seen in FIG. 5C, a first bank 180 may be formed on the planarization layer 170. The first bank 180 may be patterned on the planarization layer 170 to expose a predetermined first opening area (or a first O/A). The first bank 180 may be formed to have a third contact hole CH3 and may be exposed to the outside through the third contact hole CH3.

A side surface of the first bank 180 may be inclined at a certain angle with respect to a surface of the substrate 100. In detail, an included angle "α" between the side surface of the first bank 180 and the surface of the substrate 100 may be set to 45 degrees or less.

The side surface of the first bank 180 may be formed so as to be inclined at a certain angle by using various technologies known to those skilled in the art. For example, by using a halftone mask or a slit mask, the first bank 180 may be formed in order for a thickness thereof to be progressively thinned in an edge thereof, and moreover, may be formed to have a constant thickness in an area other than the edge, but the present embodiment is not limited thereto.

The first bank 180 may be formed of an inorganic material, for example, silicon oxide (SiOx), silicon nitride (SiNx), or a multilayer thereof, but is not limited thereto.

The first bank 180 may be formed on the planarization layer 170 through a CVD process. Therefore, the first bank 180 may be formed of a thin layer having a thickness of about 500 Å.

Figure 5D:
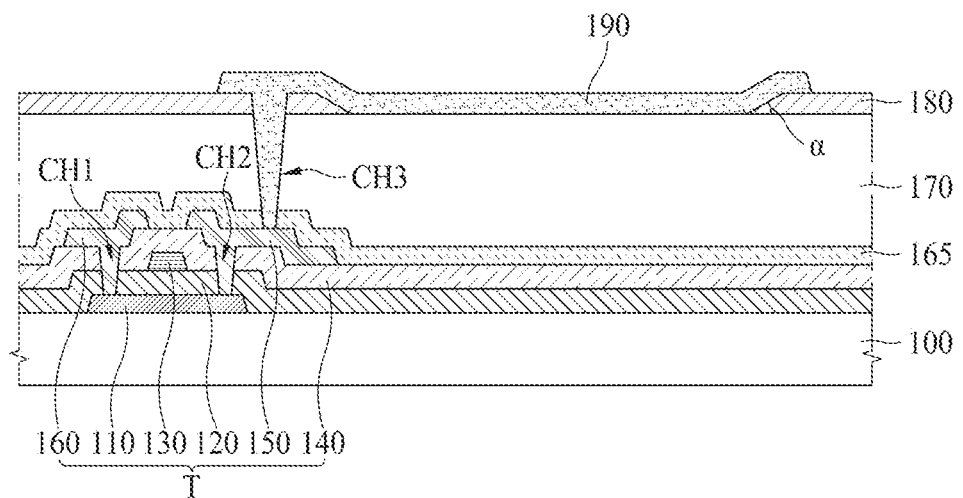

Subsequently, as seen in FIG. 5D, an anode electrode 190 may be formed on the first bank 180. The anode electrode 190 may be formed on the planarization layer 170 exposed by the first bank 180 to extend to one side and the other side of the first bank 180. A side surface of the first bank 180 may be formed to have a certain slope, and thus, an area having a certain slope may be formed in an edge of the anode electrode 190 formed on each of the one side and the other side of the first bank 180. The anode electrode 190 may be formed so as to be connected to the source electrode 150 through the third contact hole CH3 which is formed in the passivation layer 165, the planarization layer 170, and the first bank 180.

Figure 5E:
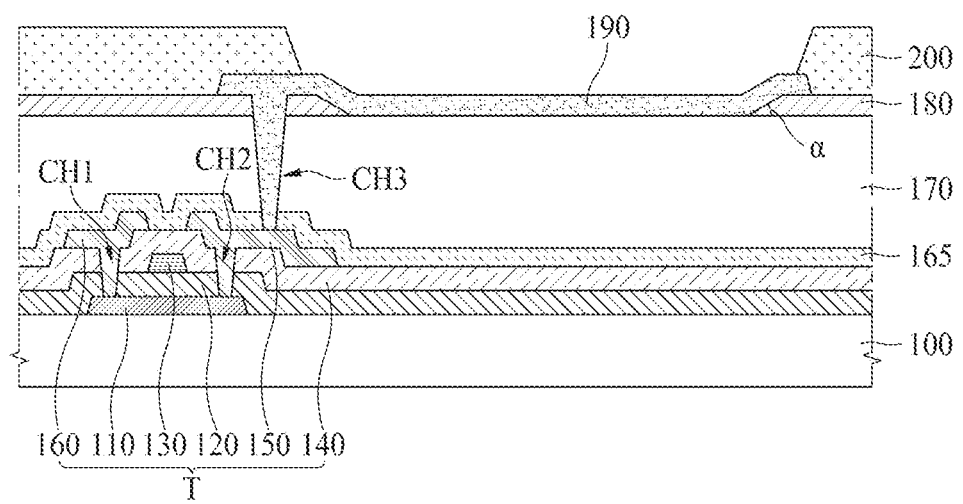

Subsequently, as seen in FIG. 5E, a second bank 200 including an organic material may be formed on the anode electrode 190. In detail, the second bank 200 may be formed on each of one side and the other side of the anode electrode 190 to expose an upper surface of the anode electrode 190. The second bank 200 may be patterned to expose a predetermined second opening area (or a second O/A). The second opening area exposed by the second bank 200 may be formed wider than the first opening area exposed by the first bank 180.

That is, in an embodiment of the present disclosure, since the second opening area is formed wider than the first opening area, a region of the anode electrode 190 having a slope may be exposed, and thus, the light emitting layer 210 may be formed from the exposed region through a below-described process, thereby decreasing a thickness deviation of the light emitting layer 210.

A process of patterning the second bank 200 on the one side and the other side of the anode electrode 190 may use a photolithography process, and the second bank 200 may be patterned through various technologies known to those skilled in the art.

In a process of forming the second bank 200 on the anode electrode 190, hydrophobic treatment may be performed on the second bank 200 in order for an upper surface of the second bank 200 to have hydrophobicity. A method of performing the hydrophobic treatment on the upper surface of the second bank 200 may use various technologies known to those skilled in the art. For example, in a process of patterning the second bank 200 with a mask, the hydrophobic treatment may be performed on the upper surface of the second bank 200 by adjusting a degree of exposure performed on the second bank 200, or by using a coating apparatus such as a roller with a hydrophobic material coated thereon, the hydrophobic material may be coated on the upper surface of the second bank 200. However, the present embodiment is not limited thereto.

Figure 5F:
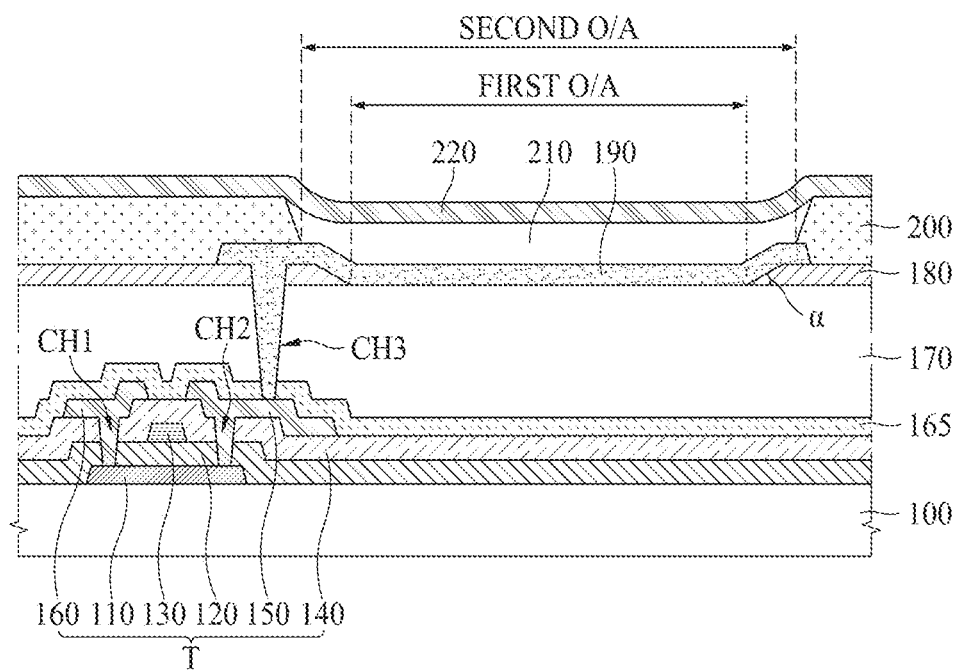

Subsequently, as seen in FIG. 5F, the light emitting layer 210 and a cathode electrode 220 may be sequentially formed on the anode electrode 190. The light emitting layer 210 may be formed by spraying a soluble light emitting material through the inkjet printing process, and as described above, the upper surface of the second bank 200 may be formed of a hydrophobic material. Accordingly, the light emitting layer 210 may be deposited up to the upper surface of the anode electrode 190 and a side surface of the second bank 200, but is not deposited on the upper surface of the second bank 200.

That is, in an embodiment of the present disclosure, the second bank 200 may be wholly formed of a hydrophilic material, and only the upper surface of the second bank 200 may be formed of a hydrophobic material, thereby preventing the light emitting layer 210 from being distributed to an emissive area of another pixel other than the upper surface of the second bank 200.

Moreover, in an embodiment of the present disclosure, the anode electrode 190 may be formed on each of one side and the other side of the first bank 180, and thus, an inclined area may be formed in an edge of the anode electrode 190. Also, the second opening area exposed by the second bank 200 may be formed wider than the first opening area exposed by the first bank 180. Therefore, the light emitting layer 210 may be formed up to an upper surface of the inclined area of the anode electrode 190, thereby reducing a thickness deviation of the light emitting layer 210.

Moreover, in an embodiment of the present disclosure, since the first bank 180 is formed before forming the anode electrode 190, the anode electrode 190 is prevented from being damaged in a process of dry etching or wet etching the first bank 180 including an inorganic material.

As described above, according to the embodiments of the present disclosure, the first bank may be formed of an inorganic material, and the anode electrode may be provided on the first bank, thereby preventing the anode electrode from being damaged in a process of forming the first bank.

Moreover, according to the embodiments of the present disclosure, a side surface of the first bank may be inclined at a certain angle with respect to a surface of the substrate, thereby preventing a leakage current from occurring in a side surface of the first bank.

Moreover, according to the embodiments of the present disclosure, the anode electrode may be connected to the source electrode through the contact hole passing through the first bank, and thus, even when the electroluminescent display device is implemented as the bottom emission type, an aperture ratio is maintained.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing an electroluminescent display device, the method comprising:
   forming a thin film transistor on a substrate;
   forming a planarization layer on the thin film transistor;
   removing a selected region of the planarization layer to form a contact hole which exposes at least a portion of the thin film transistor;
   forming a first bank layer on the planarization layer by using an inorganic material;
   forming a first opening in the first bank layer having a first opening area to expose the planarization layer and the contact hole, wherein the first bank layer has a first side surface having an inclination at a selected angle adjacent to the first opening;
   forming an anode electrode on the first bank layer and positioned within the first opening, the anode electrode having a first end and a second end, the first end positioned at a first side of the first bank layer and the second end positioned at a second side of the first bank layer, and the anode electrode extending between the first and second ends across the first opening and a portion of the anode electrode within the first opening area extending through the planarization layer to connect to the thin film transistor through the contact hole;
   forming a second bank layer including an organic material on the anode electrode and the first bank layer;
   forming a second opening in the second bank layer having a second opening area to expose the anode electrode;
   forming a light emitting layer on an upper surface of the anode electrode in the second opening exposed by the second bank layer; and
   forming a cathode electrode on the light emitting layer.

2. The method according to claim 1, forming the second bank layer comprises:
   depositing a blanket layer of material;
   etching away a portion of the second bank layer to form an exposed area of the anode electrode.

3. The method according to claim 2, wherein the exposed area of the anode electrode is wider than the area of the substrate exposed by the first bank layer.

4. The method according to claim 1 wherein the first bank layer has a side surface adjacent to the first opening, the first bank layer side surface being inclined at a first selected angle.

5. The method according to claim 1 wherein the second bank layer has a side surface adjacent to the second opening, the second bank layer side surface being inclined at a second selected angle that is larger than the first selected angle.

6. The method according to claim 1, wherein the second bank layer partially overlaps the first end and the second end of the anode electrode, wherein the second opening area is wider than the first opening area.

7. A method of manufacturing an electroluminescent display device, the method comprising:
   forming a thin film transistor on a substrate;
   forming a planarization layer on the thin film transistor;
   forming a first bank layer on a substrate by using an inorganic material;
   removing a certain region of each of the planarization layer and the first bank layer to form a contact hole which exposes at least a portion of the thin film transistor;
   forming a first opening in the first bank layer having a first area to expose the planarization layer excepting the contact hole, the first bank layer having a side surface at the first opening, the first bank layer side surface being inclined at a selected angle;
   forming an anode electrode on the first bank layer and positioned within the first opening, the anode electrode having a first end and a second end, the first end positioned at a first side of the first bank layer and the second end positioned at a second side of the first bank layer, and the anode electrode extending between the first end and the second end, across the first opening and a portion of the anode electrode solely extending through the planarization layer and the first bank layer to connect to the thin film transistor through the contact hole;

forming a second bank layer including an organic material on the anode electrode and the first bank layer;

forming a second opening in the second bank layer having a second area to expose the anode electrode, the second bank layer having a side surface at the second opening, the second bank layer side surface being inclined at a second selected angle that is larger than the first selected angle;

forming a light emitting layer on an upper surface of the anode electrode in the second opening exposed by the second bank layer; and forming a cathode electrode on the light emitting layer.

8. The method according to claim 7, wherein the first angle is about 45°.

9. The method according to claim 7, wherein the first angle is less than 45° and greater than 30°.

10. The method according to claim 7, wherein the first angle is less than 40° and greater than 25°.

11. The method according to claim 7, wherein the first angle is less than 60° and greater than 45°.

12. The method according to claim 7, wherein the second bank layer partially overlaps the first end and the second end of the anode electrode, wherein the second area is larger than the first area.

* * * * *